US009377608B2

(12) United States Patent
Wolf

(10) Patent No.: US 9,377,608 B2
(45) Date of Patent: Jun. 28, 2016

(54) IMAGING OPTICAL UNIT

(71) Applicant: Carl Zeiss SMT GmbH, Oberkochen (DE)

(72) Inventor: Alexander Wolf, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 188 days.

(21) Appl. No.: 14/080,743

(22) Filed: Nov. 14, 2013

(65) Prior Publication Data

US 2014/0071418 A1  Mar. 13, 2014

Related U.S. Application Data

(63) Continuation of application No. PCT/EP2012/059697, filed on May 24, 2012.

(60) Provisional application No. 61/491,523, filed on May 31, 2011.

(30) Foreign Application Priority Data

May 31, 2011 (DE) .......................... 10 2011 076 752

(51) Int. Cl.
    *G03B 27/54* (2006.01)
    *G02B 17/06* (2006.01)
    (Continued)

(52) U.S. Cl.
    CPC ........ *G02B 17/0647* (2013.01); *G02B 17/0663* (2013.01); *G02B 27/0081* (2013.01); *G03F 7/70058* (2013.01); *G03F 7/70275* (2013.01)

(58) Field of Classification Search
    CPC ........... G02B 17/0647; G02B 17/0663; G02B 27/0081; G03F 7/70058; G03F 7/70275

USPC ........................................................ 355/67
See application file for complete search history.

(56) References Cited

U.S. PATENT DOCUMENTS 4,861,148 A   8/1989 Sato et al.
6,307,682 B1 10/2001 Hoffman et al.
(Continued)

FOREIGN PATENT DOCUMENTS

CN   101836 151 A   9/2010
CN   103080841 A    5/2013
(Continued)

OTHER PUBLICATIONS

International Search Report for corresponding PCT Appl. No. PCT/EP2012/059697, dated Sep. 25, 2012.
(Continued)

*Primary Examiner* — Peter B Kim
(74) *Attorney, Agent, or Firm* — Fish & Richardson P.C.

(57) ABSTRACT

An imaging optical unit serves for imaging an object field into an image field. An imaging beam path (AS) between the object field and the image field is subdivided into a plurality of partial imaging beam paths (TAS). The imaging optical unit is embodied such that the partial imaging beam paths (TAS) run between the object field and the image field in a manner completely separated from one another and guided by optical components (M1 to M6) of the imaging optical unit, that is to say that nowhere in the beam path between the object field and the image field do the partial imaging beam paths (TAS) impinge on identical regions of beam-guiding surfaces of the imaging optical unit. This results in an imaging optical unit in which a resolution capability, particularly in the production of micro- or nanostructured semiconductor components, is increased.

20 Claims, 9 Drawing Sheets

(51) Int. Cl.
*G02B 27/00* (2006.01)
*G03F 7/20* (2006.01)

(56) References Cited

U.S. PATENT DOCUMENTS

| | | |
|---|---|---|
| 7,414,781 B2 | 8/2008 | Mann et al. |
| 2008/0246932 A1 | 10/2008 | Shigematsu |
| 2010/0231884 A1 | 9/2010 | Mann |
| 2010/0231885 A1 | 9/2010 | Mann |
| 2013/0070227 A1 | 3/2013 | Mueller et al. |

FOREIGN PATENT DOCUMENTS

| | | |
|---|---|---|
| JP | 2011-7941 A | 1/2011 |
| KR | 10-2010-0117281 A | 11/2010 |
| WO | WO 2012/025365 | 3/2012 |

OTHER PUBLICATIONS

German Examination Report, with translation thereof, for corresponding DE Appl No. 10 2011 076 752.5, dated Aug. 17, 2011.
Chinese office action, with English translation thereof, for CN Appln No. 2012 8002 6502.0 dated Apr. 3, 2015.

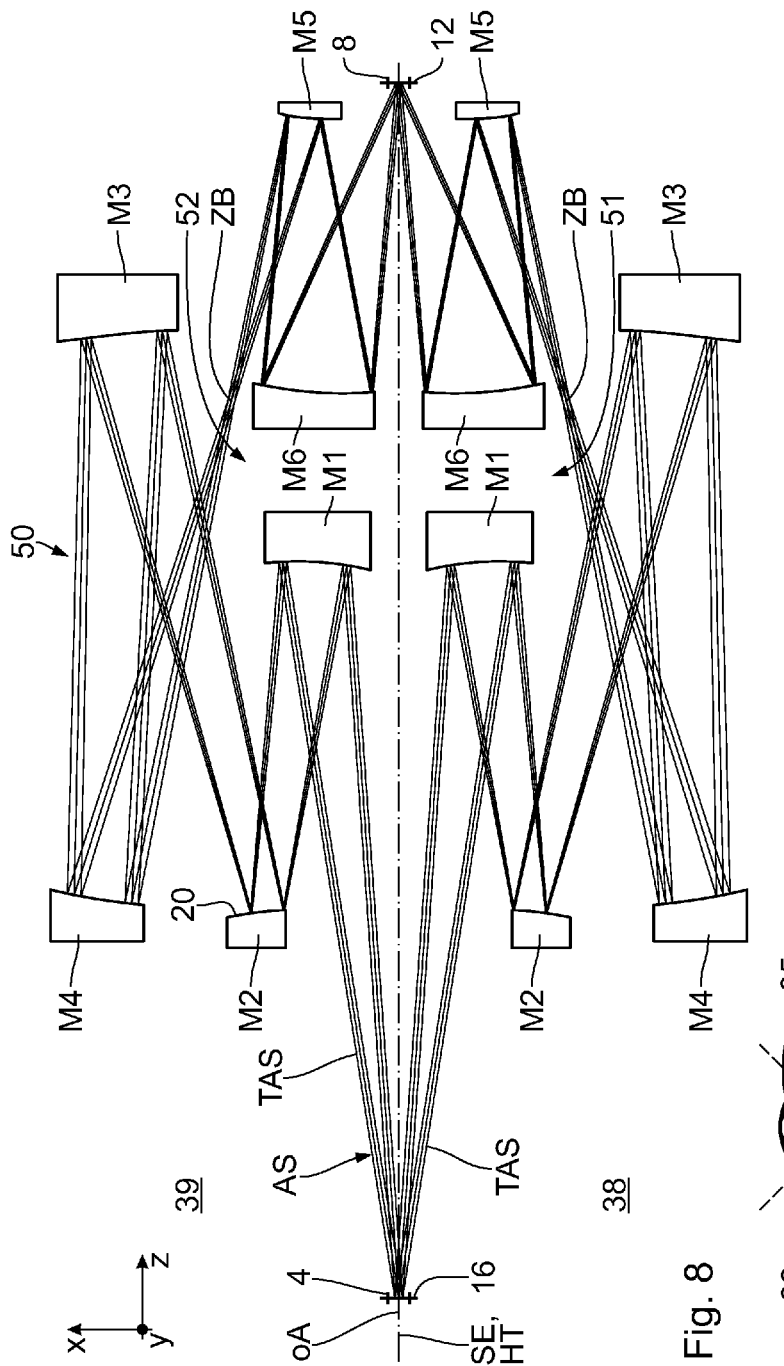
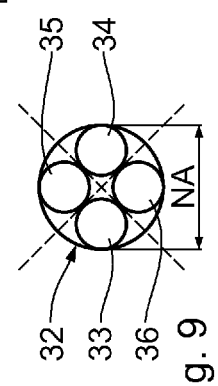
Fig. 8
Fig. 9

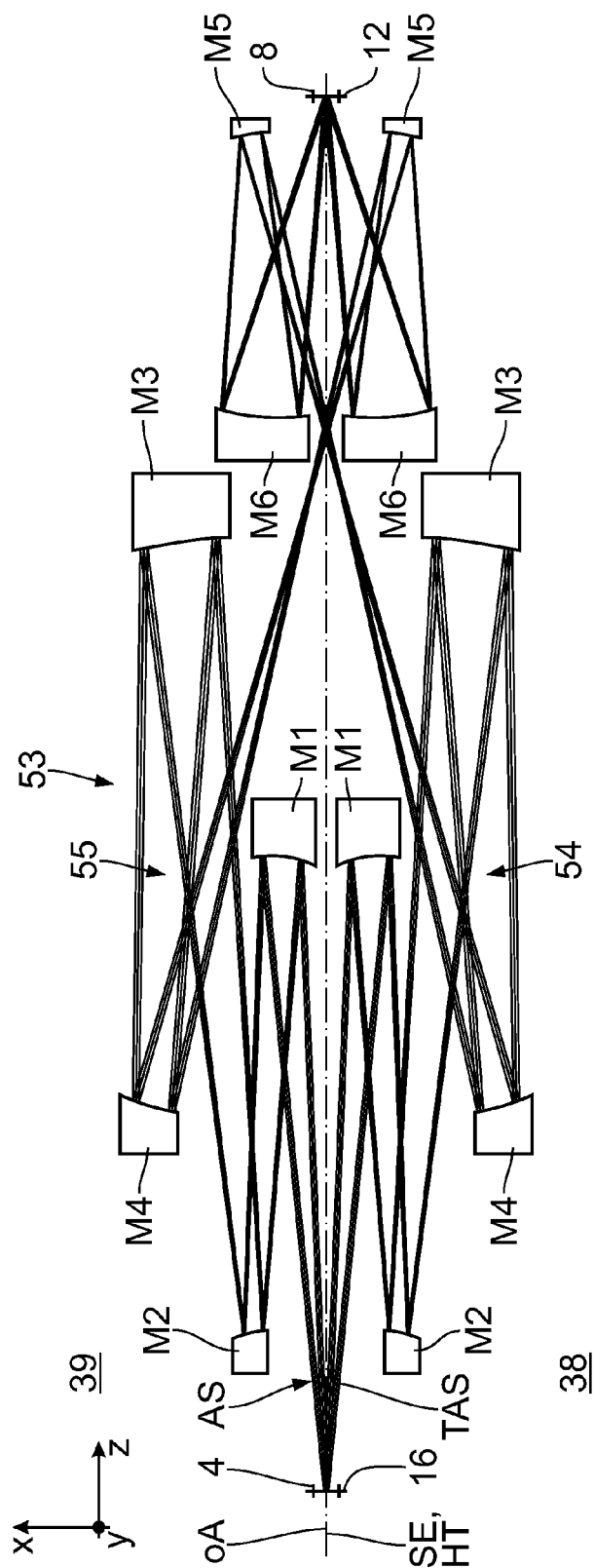
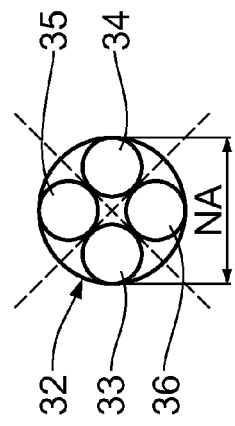
Fig. 10
Fig. 11

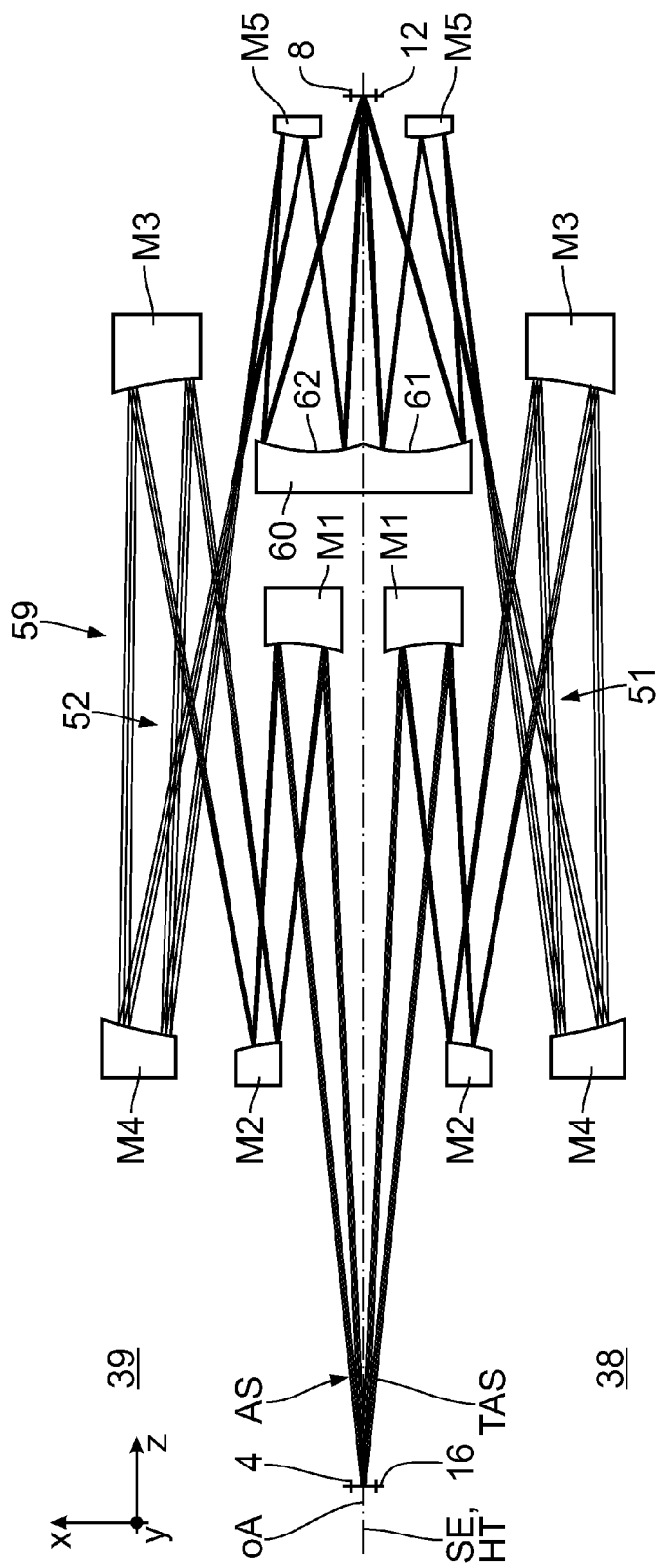
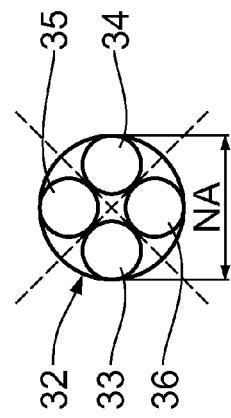
Fig. 14
Fig. 15

IMAGING OPTICAL UNIT

CROSS-REFERENCE TO RELATED APPLICATIONS

The present application is a continuation of, and claims benefit under 35 USC 120 to, international application PCT/EP2012/059697, filed May 24, 2012, which claims benefit under 35 USC 119 of German Application No. 10 2011 076 752.5, filed May 31, 2011International application PCT/EP2012/059697also claims priority under 35 USC 119(e) to U.S. Provisional Application No. 61/491,523, filed May 31, 2011. The contents of German Application No. 10 2011 076 752.5international application PCT/EP2012/059697 are hereby incorporated by reference in its entirety.

The invention relates to an imaging optical unit for imaging an object field into an image field. Furthermore, the invention relates to an optical system comprising an imaging optical unit of this type and an illumination optical unit for illuminating the object field, a projection exposure apparatus comprising an optical system of this type and a light source, a method for producing a micro- or nanostructured component with the aid of a projection exposure apparatus of this type, and a patterned component, produced according to a method of this type.

Imaging optical units of the type mentioned in the introduction are known from US 2010/0231885 A1 and U.S. Pat. No. 7,414,781 B2.

It is an object of the present invention to develop an imaging optical unit of the type mentioned in the introduction in such a way that a resolution capability of the imaging optical unit, particularly for use in the production of micro- or nanostructured semiconductor components, is increased.

This object is achieved according to the invention an imaging optical unit for imaging an object field into an image field. An imaging beam path between the object field and the image field is subdivided into a plurality of partial imaging beam paths. The imaging optical unit is embodied such that the partial imaging beam paths run between the object field and the image field in a manner completely separated from one another and guided by optical components of the imaging optical unit. Nowhere in the beam path between the object field and the image field do the partial imaging beam paths impinge on identical regions of beam-guiding surfaces of the imaging optical unit.

The guidance according to the invention of mutually separated partial imaging beam paths between the object field and the image field results in a total numerical aperture of the imaging optical unit, in particular a total image-side numerical aperture, which is composed of the numerical apertures of partial optical units which respectively guide the partial imaging beam paths.

This effectively results in an enlargement of a field-side total numerical aperture. The total numerical aperture can be spanned by the numerical apertures of the partial optical units, such that the total numerical aperture can be larger than a sum of the numerical apertures of the partial optical units. A pupil of the imaging optical units can be composed of partial pupils of the partial optical units which do not overlap one another in a pupil plane. A pupil obscuration of the imaging optical unit can be less than 50%, can be less than 40%, can be less than 35%, and can be in particular 31%. The numerical value of the pupil obscuration in percent is defined as a ratio of the area within a pupil that is masked out on account of the pupil obscuration relative to a total area of the pupil of the imaging optical unit.

At least two mutually separated partial pupils of partial optical units which guide the partial imaging beam paths firstly enable the partial imaging beam paths to be guided separately, and additionally produce illumination from different illumination angles. More than two mutually separated partial pupils are also possible, for example three or four mutually separated partial pupils of partial optical units guiding the partial imaging beam paths. An even greater number of partial pupils separated from one another is also possible, for example five, six, seven, eight or even nine partial pupils.

A multi-fold symmetrical arrangement of the partial pupils of the partial optical units —guiding the partial imaging beam paths —of the imaging optical unit arranged in a pupil of the imaging optical unit with multi-fold symmetry about a central optical axis running perpendicular to the pupil is adapted well to the symmetry of object structures typically to be imaged. The multi-fold symmetry can be a two-fold, three-fold, four-fold or generally an n-fold symmetry.

A multi-fold symmetrical arrangement of partial optical units which build up the imaging optical unit, about the optical axis has advantages corresponding to those of the multi-fold symmetrically arranged partial pupils.

A mirror symmetry of the optical component of the imaging optical unit undergo transition to one another by mirroring about a mirror symmetry plane in which the optical axis runs reduces the production outlay for the imaging optical unit.

A half-space separation of the optical component so that the optical components of two partial optical units are completely arranged each respectively in one of two half-spaces separated from one another by a half-space separating plane in which the optical axis runs facilitates a design of the imaging optical unit. The half-space separating plane can coincide with the mirror symmetry. Since a half-space separation can be effected even when the partial optical units are not arranged mirror-symmetrically with respect to one another, this is not mandatory.

In the case of an arrangement in which the optical components of at least one of the partial optical units are arranged in a distributed manner in both half-spaces separated from one another by the half-space separating plane, at least one optical component of one of the partial optical units is arranged in one half-space and at least another optical component of the partial optical unit is arranged in the other half-space. Interpenetrating designs of the partial optical units are possible in this way, which increases the degrees of freedom of design.

In the case of an arrangement in which, on the object side, the partial imaging beam paths of at least two partial optical units of the imaging optical unit have chief rays: proceed from a central object field point; are in a meridional plane running perpendicular to a half-space separating plane; and are in the same half-space, in particular reflective objects which are imaged can also be used. An oblique illumination is possible.

An image-side numerical aperture of 0.2 for the partial optical units has proved to be advantageous. An image-side total numerical aperture can then be 0.5, for example.

A catoptric embodiment has proved to be advantageous. It is possible to use e.g. six mirrors per partial optical unit. A different number of mirrors, in particular an odd number, is also possible.

A monolithic embodiment of at least one of the optical components increases the stability of the imaging optical unit.

The advantages of an optical system including an illumination system and imaging optical system described herein, of a projection exposure apparatus including such an optical system and a light source, of a method for producing a micro- or nanostructured component using such a projection exposure apparatus, and of a patterned component according to such a method, for example of an integrated semiconductor circuit, for example of a memory chip, correspond to those which have already been explained above with reference to the imaging optical unit according to the invention. The light source can be, in particular, an EUV light source, which leads to a high structural resolution of the projection exposure apparatus.

Exemplary embodiments of the invention are explained in greater detail below with reference to the drawings, in which:

FIG. 1 schematically shows a projection exposure apparatus for EUV microlithography;

FIG. 8 shows in a meridional section a further embodiment of the projection optical unit;

FIG. 9 shows, in an illustration similar to FIG. 6, an entrance pupil of the projection optical unit according to FIG. 8;

FIG. 10 shows in a meridional section a further embodiment of the projection optical unit;

FIG. 11 shows, in an illustration similar to FIG. 6, an entrance pupil of the projection optical unit according to FIG. 10;

FIG. 14 shows in a meridional section a further embodiment of the projection optical unit;

FIG. 15 shows, in an illustration similar to FIG. 6, an entrance pupil of the projection optical unit according to FIG. 14.

Figure 1:
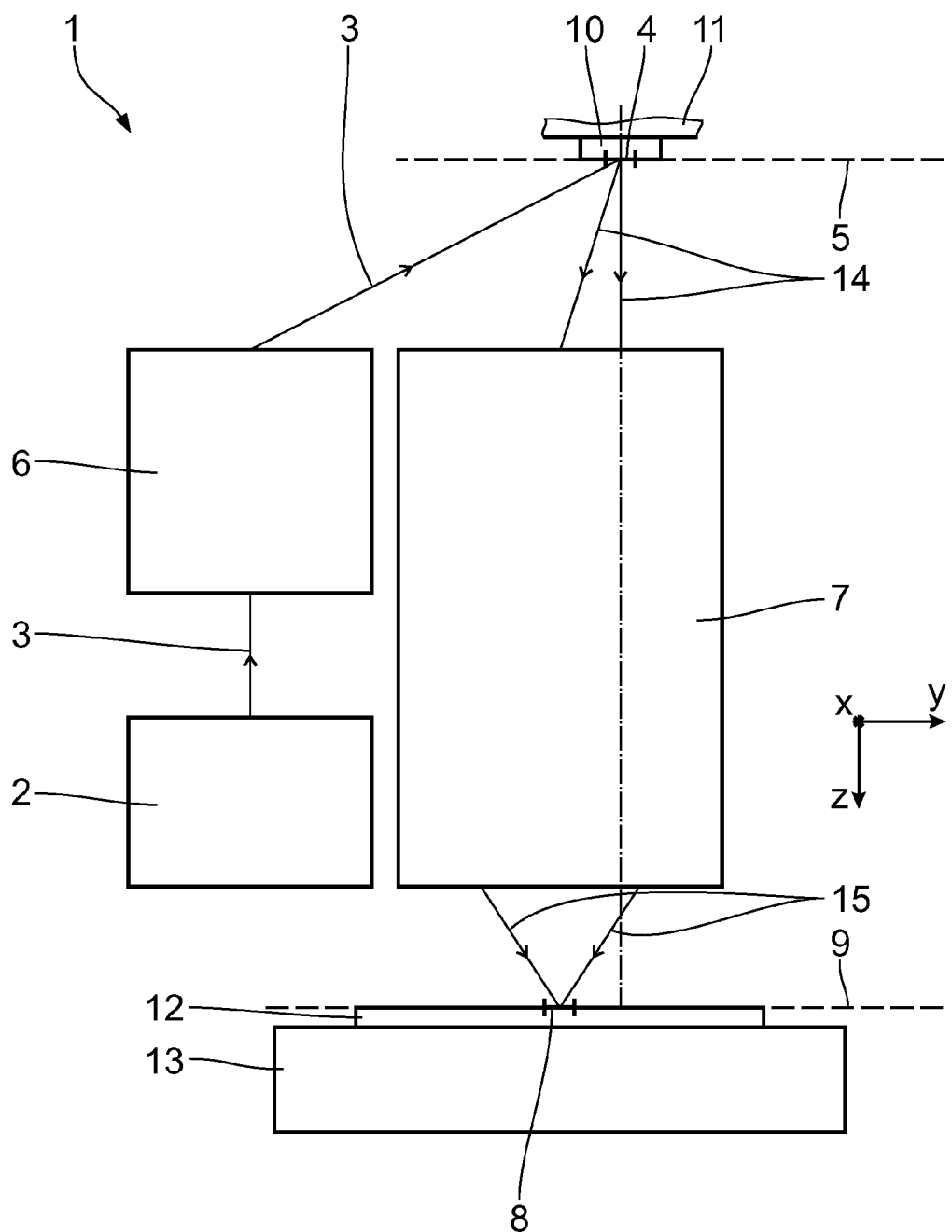

A projection exposure apparatus 1 for microlithography has a light source 2 for illumination light or imaging light 3. The light source 2 is an EUV light source, which generates light in a wavelength range of, for example, between 5 nm and 30 nm, in particular between 5 nm and 15 nm. The light source 2 can be, in particular, a light source having a wavelength of 13.5 nm or 6.9 nm. An LPP (laser produced plasma) light source or a GDP (gas discharge produced plasma) light source can be involved. Other EUV wavelengths are also possible. Generally, even arbitrary wavelengths, for example visible wavelengths or else other wavelengths which can be used in microlithography and are available for the suitable laser light sources and/or LED light sources (for example 365 nm, 248 nm, 193 nm, 157 nm, 129 nm, 109 nm), are possible for the illumination light 3 guided in the projection exposure apparatus 1. A beam path of the illumination light 3 is illustrated extremely schematically in FIG. 1.

An illumination optical unit 6 serves for guiding the illumination light 3 from the light source 2 toward an object field 4 in an object plane 5. Via a projection optical unit or imaging optical unit 7, the object field 4 is imaged into an image field 8 in an image plane 9 with a predetermined reduction scale. The illumination optical unit 6 and the projection optical unit 7 constitute an optical system of the projection exposure apparatus 1. One of the exemplary embodiments illustrated in FIG. 2 ff. can be used for the projection optical unit 7. The projection optical unit 7 according to FIG. 1 reduces by a factor of 8. Other reduction scales are also possible, for example 4×, 5×, or even reduction scales greater than 8×. For the illumination light 3 having an EUV wavelength, an imaging scale of 8× is suitable, in particular, since an object-side angle of incidence on a reflection mask as an example of a reticle 10 to be imaged can thereby be kept small. The reticle 10 carries the structures to be imaged via the projection exposure apparatus 1. Moreover, an imaging scale of 8× does not lead to the necessity of using unnecessarily large masks. In the case of the projection optical unit 7 in the embodiments according to FIG. 2 ff., the image plane 9 is arranged parallel to the object plane 5. An excerpt from the reflection mask 10, which is also designated as reticle, the excerpt coinciding with the object field 4, is imaged in this case. The reflection mask 10 is carried by a reticle or mask holder 11.

The imaging by the projection optical unit 7 is effected onto the surface a substrate 12 in the form of a wafer, which is carried by a substrate or wafer holder 13. FIG. 1 schematically illustrates, between the reticle 10 and the projection optical unit 7, a beam 14 of the illumination light 3 entering into the projection optical unit and, between the projection optical unit 7 and the substrate 12, a beam 15 of the illumination light 3 emerging from the projection optical unit 7. An image-field-side numerical aperture of the projection optical unit 7 in the embodiment according to FIG. 2 can be 0.4 or even greater. This is not represented to scale in FIG. 1.

In order to facilitate the description of the projection exposure apparatus 1 and the various embodiments of the projection optical unit 7, a Cartesian xyz coordinate system is indicated in the drawing, from which system the respective positional relationship of the components illustrated in the figures is evident. In FIG. 1, the x-direction runs perpendicular to the plane of the drawing into the latter. The y-direction runs toward the right, and the z-direction runs downward.

The projection exposure apparatus 1 is of the scanner type. Both the reticle 10 and the substrate 12 are scanned in the y-direction during the operation of the projection exposure apparatus 1. A stepper type of the projection exposure apparatus 1, in which a stepwise displacement of the reticle 10 and of the substrate 12 in the y-direction takes place between individual exposures of the substrate 12, is also possible.

Concrete examples concerning the configuration of the projection optical unit 7 will also be explained below with reference to FIG. 8 ff. and in particular with reference to FIGS. 12 and 13.

Figure 2:
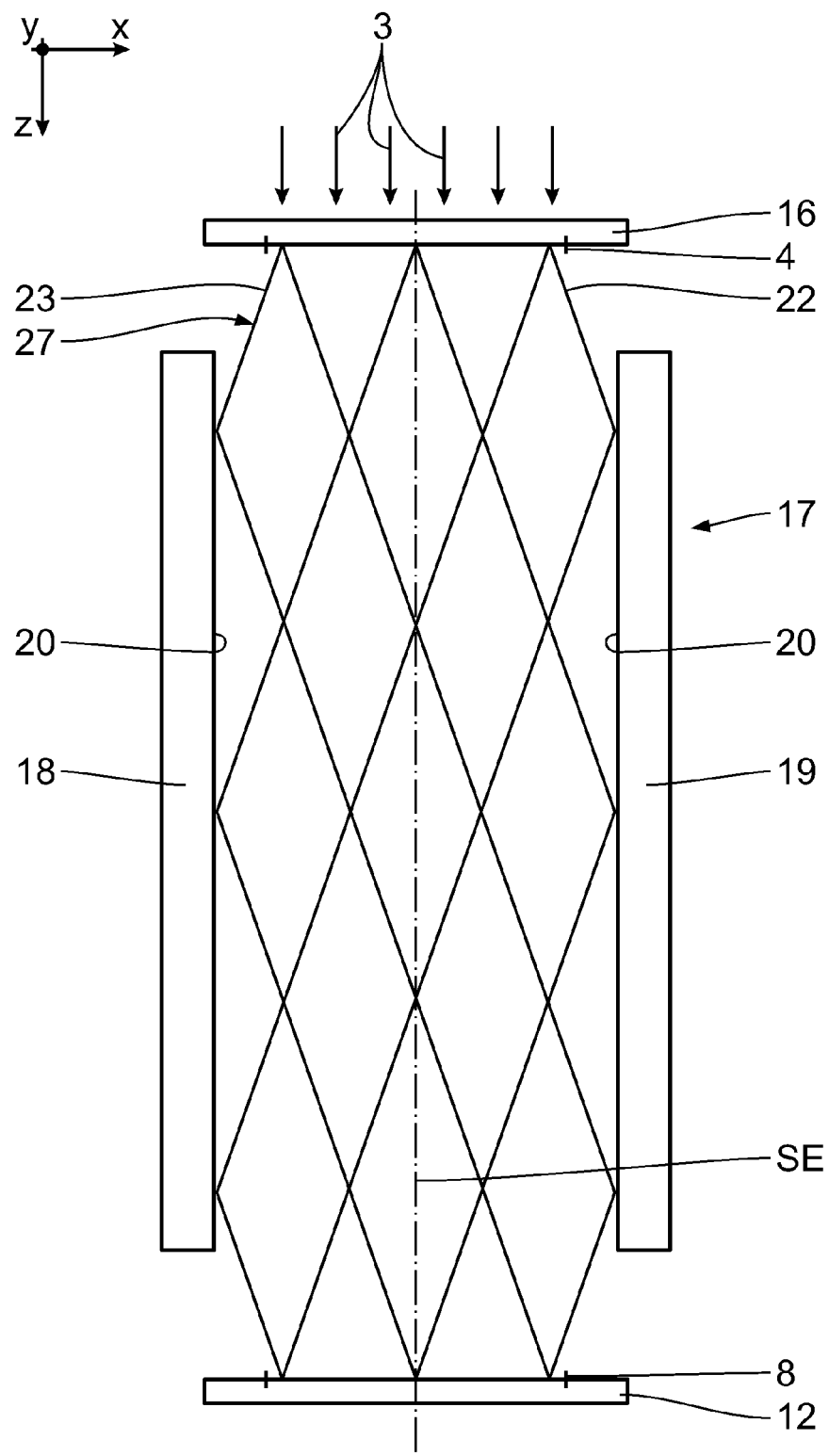
FIG. 2 shows in a side view (plane of the drawing perpendicular to an object plane and to an image plane) an embodiment of a projection optical unit of the projection exposure apparatus.
Figure 3:
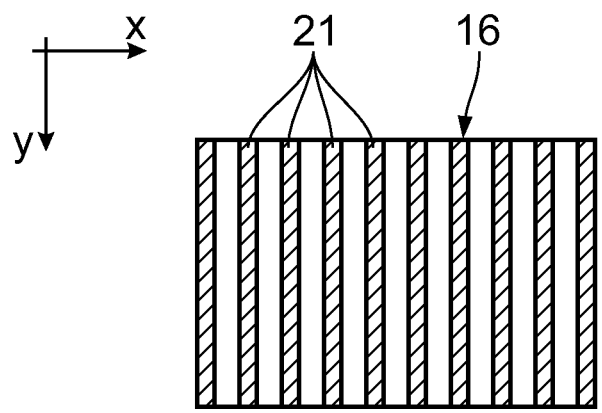
FIG. 3 shows in a plan view a transmission mask used when the projection optical unit according to FIG. 2 is used instead of a reflection mask shown in FIG. 1 for imaging purposes.

Instead of a reflection mask as in the case of the reticle 10 of the embodiment according to FIG. 1, as reticle 10 it is also possible to use a transmission mask in the form of a phase mask, which is illustrated in a plan view in FIG. 2.

For the purpose of imaging the phase mask 16, FIG. 2 illustrates a projection optical unit 17 that can be used instead of the projection optical unit 7 of the arrangement according to FIG. 1. Components corresponding to those which have already been explained above with reference to the schematic illustration according to FIG. 1 bear the same reference numerals and will not be discussed in specific detail again.

The projection optical unit 17 images the object field 4 into the image field 8 with an imaging scale of 1x.

The projection optical unit 17 has two plane mirrors 18, 19, the reflection surfaces 20 of which face one another and run parallel to one another in each case in a plane parallel to the yz plane. The projection optical unit 17 is constructed in the manner of a Mach-Zehnder interferometer. The mirrors 18, 19 constitute partial optical units of the projection optical unit 17.

The phase mask 16 has line structures 21 running parallel to the y-direction. The illumination optical unit 6 for illuminating the phase mask 16 is embodied such that the illumination light 3 impinges on the phase mask 16 in collimated fashion. A diffraction of the illumination light 3 arises on account of the linear structuring of the phase mask 16. The pitch of the line structures 21 is coordinated with a wavelength of the illumination light 3 such that the illumination light 3 which impinges on the phase mask 16 in the z-direction is split into a −1st diffraction order 22 and into a +1st diffraction order 23. The rays of the illumination light 3 of the −1st diffraction order 22, on the one hand, and of the +1st diffraction order 23, on the other hand, the rays being diffracted at the phase mask 16, all leave the phase mask 16 at exactly the same −1st and +1st diffraction angle, respectively, and enter into the projection optical unit 17 at the −1st and +1st diffraction angle, respectively. Therefore, the illumination light 3 passes through an entrance pupil 24, which is illustrated in a plan view in FIG. 4, at exactly two discrete pupil locations 25 and 26. In this case, the pupil location 25 represents the illumination angle of the −1st diffraction order 22. The pupil location 26 represents the illumination angle of the +1st diffraction order 23.

The two diffraction orders 22, 23 represent partial imaging beam paths of a total imaging beam path 27 of the illumination light 3 in the illumination optical unit 17 between the object field 4 and the image field 8. The two partial imaging beam paths 22, 23 run between the object field 4 and the image field 8 in a manner completely separated from one another and guided by the optical components of the projection optical unit 17, that is to say by the plane mirrors 18, 19. The −1st diffraction order 22 is exclusively reflected by the plane mirror 19 on the right in FIG. 2. The +1st diffraction order 23 is exclusively reflected by the plane mirror 18 on the left in FIG. 2. Nowhere in the imaging beam path 27 between the object field 4 and the image field 8 do the two partial imaging beam paths 22, 23 impinge on identical regions of beam-guiding surfaces of the projection optical unit 17, that is to say identical regions on the reflection surfaces 20 of the plane mirrors 18, 19.

Figure 4:
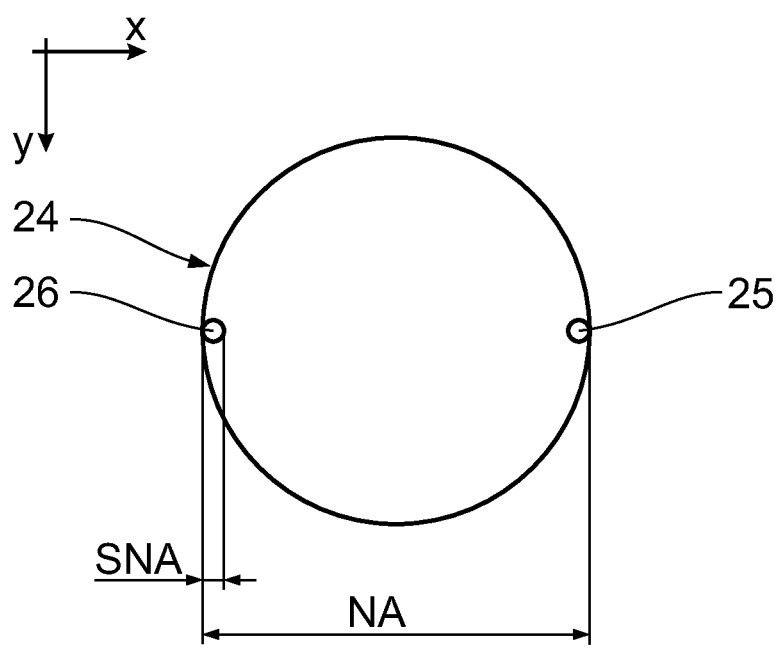
FIG. 4 shows a plan view of an entrance pupil of the projection optical unit according to FIG. 2.

The diameter —designated by NA in FIG. 4 —of the entrance pupil 24 represents an effective numerical aperture of the projection optical unit 17. On account of the imaging scale of 1x, the object-side numerical aperture NA is of exactly the same size as the image-side numerical aperture NA. A diameter SNA of the pupil locations 25, 26 represents a subaperture of the diffraction orders 22, 23. In the ideal case of a perfectly collimated illumination of the phase mask 16, the subaperture SNA is practically zero. The following generally holds true: SNA ≪ NA. For the ratio, for example 2<NA/SNA<100 can hold true.

The projection optical unit 17, which is constructed in a very simple manner, makes it possible to realize a very high effective NA and thus a correspondingly high resolution capability, which can be used for the projection imaging of even very small structures, that is to say fine line structures 21.

Figure 5:
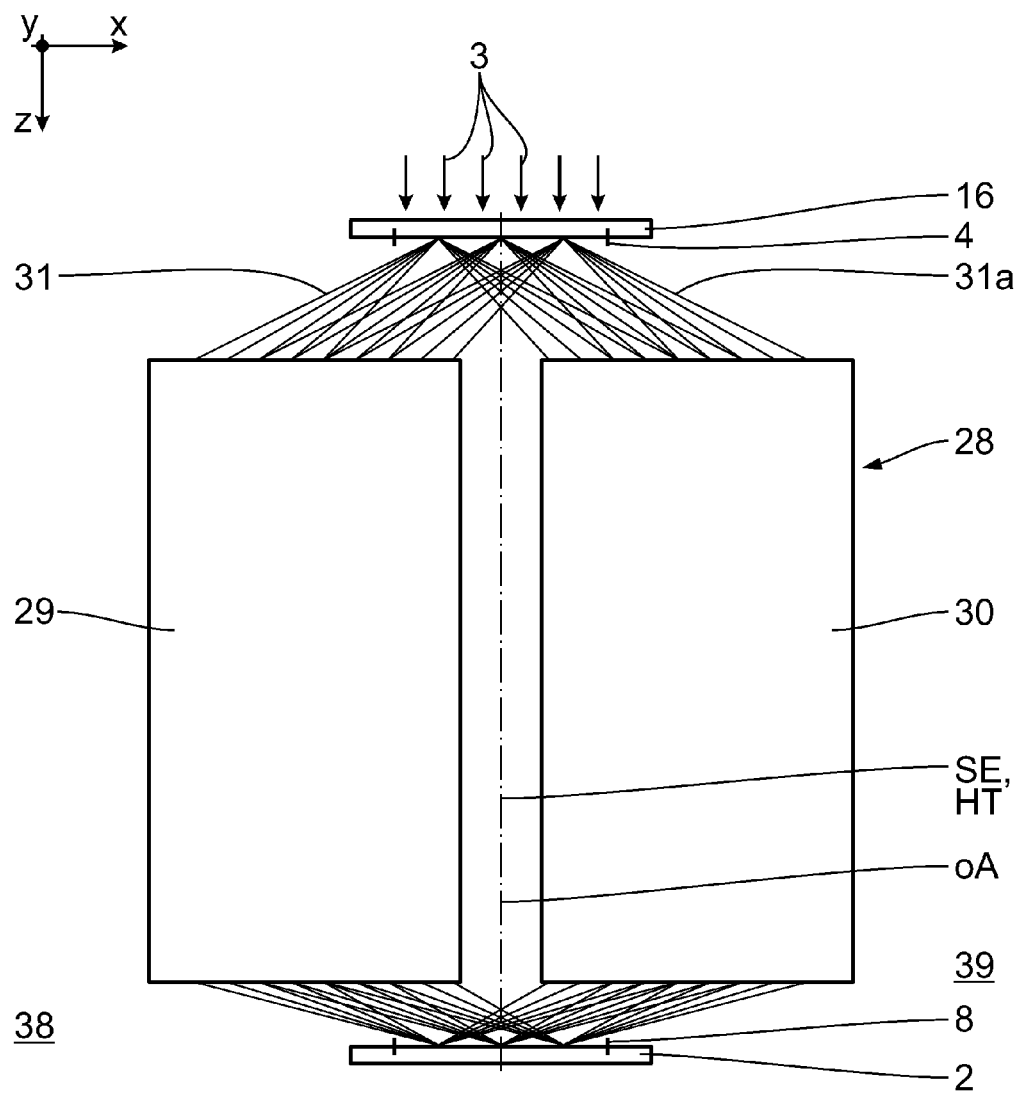
FIG. 5 shows, in an illustration similar to FIG. 2, a further embodiment of a projection optical unit for use in the projection exposure apparatus instead of the projection optical unit according to FIG. 2.

A further embodiment of a projection optical unit 28 is explained below with reference to FIGS. 5 and 6, which can be used instead of the projection optical unit 17 according to FIG. 2. Components corresponding to those which have already been explained above with reference to FIGS. 1 to 4 bear the same reference numerals and will not be discussed more specifically again.

The projection optical unit 28 does not presuppose perfectly or almost perfectly collimated illumination. The projection optical unit 28 comprises a total of four partial lenses, of which two partial lenses, namely the partial lenses 29 and 30, are illustrated in the sectional illustration along an xz central plane according to FIG. 5. A total imaging beam path of the projection optical unit 28 is designated by AS. An imaging beam path guided only by one of the partial lenses is designated by TAS.

A first diffraction order 31 running substantially in the xz plane or adjacent thereto represents a partial imaging beam path between the object field 4 and the image field 8, the path being guided by the partial lens 29.

A −1st diffraction order 31a running substantially in the xz plane or adjacent thereto represents a partial imaging beam path between the object field 4 and the image field 8, the path being guided by the partial lens 30.

Figure 6:
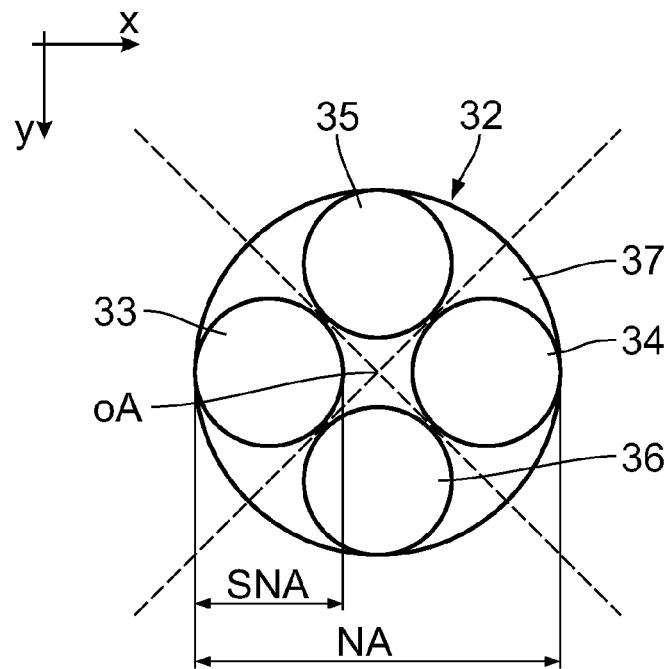
FIG. 6 shows, in an illustration similar to FIG. 4, an entrance pupil of the projection optical unit according to FIG. 5.

FIG. 6 shows an entrance pupil 32 of the projection optical unit 28. Within a diameter of the entrance pupil 32, that is to say within the effective numerical aperture NA, partial pupils 33 to 36 are arranged in four quadrants. The partial pupil 33, arranged in the left quadrant of the entrance pupil 32 in FIG. 6, is assigned to the first diffraction order 31. The partial pupil 34, arranged in the right quadrant in FIG. 6, is assigned to the −1st diffraction order 31a. Correspondingly, the two further partial pupils 35, 36 arranged in the upper and lower quadrants, respectively, in the figure are assigned to the +/−1st diffraction orders of the two further partial lenses (not illustrated) which are deflected in the yz plane.

The partial pupils 33 to 36 each have a circular border. The partial pupils 33 to 36 each have the same diameter SNA in the entrance pupil 32. In the case of the embodiment according to FIG. 6, the following holds true:

$$SNA = NA/(1+\sqrt{2})$$

The partial pupils 33 to 36 are completely separated from one another, that is to say do not overlap, in the entrance pupil 32. Outside the four partial pupils 33 to 36, an obscuration area 37 is present in the entrance pupil 32, the obscuration surface not being used for the passage of imaging light. The projection optical unit 28 has a pupil obscuration of 31%. In this case, the pupil obscuration represents the ratio of the obscuration area 37, that is to say the area within the entrance pupil 32 that is masked out on account of a pupil obscuration, relative to the total area of the entrance pupil 32.

The partial pupils 33 to 36 are arranged in a pupil plane predetermined by the entrance pupil 32, the pupil plane running parallel to the xy plane, with four-fold symmetry about a central optical axis oA. The optical axis oA runs perpendicular to the pupil plane of the entrance pupil 32. The optical axis oA runs perpendicular to the object plane 5. The optical axis oA runs perpendicular to the image plane 9.

In accordance with the multi-fold symmetry of the arrangement of the partial pupils 33 to 36 about the optical axis oA, the partial lenses 29, 30 and the two further partial lenses (not illustrated in FIG. 5) of the projection optical unit 28 are also arranged with multi-fold symmetry about the optical axis oA. The partial optical units of the projection optical unit 28, that is to say for example the partial optical units 29 and 30, undergo transition to one another by mirroring about a mirror symmetry plane SE in which the optical axis oA runs. In the case of the two partial optical units 29, 30, the mirror symmetry plane SE runs perpendicular to the image plane in FIG. 5, that is to say is a plane parallel to the yz plane. A further mirror symmetry plane for the other two partial lenses (not illustrated) of the projection optical unit 28 coincides with the plane of the drawing in FIG. 5.

The optical components of the two partial optical units 29, 30 run completely in each respectively one of two half-spaces 38, 39, which are separated from one another by a half-space separating plane HT in which the optical axis oA runs. In the case of the embodiment according to FIG. 5, the half-space separating plane HT coincides with the mirror symmetry plane SE.

The partial pupils 33 to 36 are arranged such that structures running in the x-direction and/or in the y-direction on the phase mask 16 can be imaged preferably and with good, high-resolution imaging quality via the projection optical unit 28.

Figure 7:
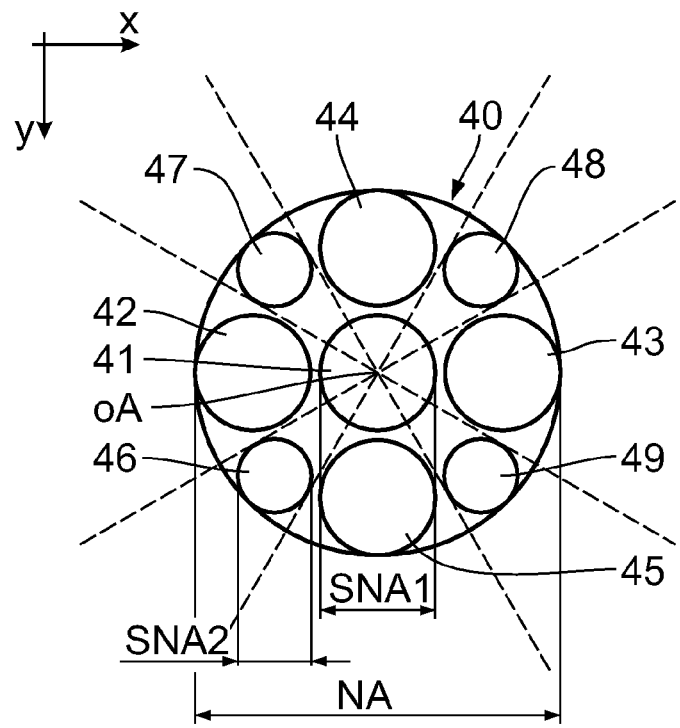
FIG. 7 shows, in an illustration similar to FIG. 6, an entrance pupil of a further embodiment of the projection optical unit.

FIG. 7 shows, in an illustration similar to FIG. 6, an entrance pupil 40 of a further embodiment of a projection optical unit (otherwise not illustrated) with a total of nine partial pupils 41 to 49. Components corresponding to those which have already been explained above with reference to the embodiments according to FIGS. 1 to 6 bear the same reference numerals and will not be discussed more specifically again.

The partial pupil 41 lies centrally in the entrance pupil 40 and has a diameter SNA1 in the entrance pupil 40. The four further partial pupils 42 to 45 are arranged in the four quadrants of the entrance pupil 40 in a manner comparable to the partial pupils 33 to 36 of the embodiment according to FIGS. 5 and 6. The partial pupils 42 to 45 also have the diameter SNA1 in the entrance pupil 40. A ratio SNA1/NA is smaller in the case of the arrangement according to FIG. 7 than in the case of that according to FIG. 6. In a circumferential direction in each case between adjacent partial pupils from among the partial pupils 42 to 45, the remaining four partial pupils 46 to 49 are situated in the entrance pupil 40, and have a diameter of SNA 2 in the entrance pupil 40. SNA1>SNA2 holds true. The partial pupils 41 to 49 also do not overlap in the entrance pupil 40. All of the partial pupils 41 to 49 are spatially separated from one another.

The partial pupils 42 to 49 are inscribed into the entrance pupil 40 such that the circumferential lines around the partial pupils 42 to 49 touch the circumferential line around the entrance pupil 40.

A configuration of a projection optical unit with partial lenses or partial optical units having the partial pupils 41 to 49 makes it possible to image even relatively complicated structures on the reticle, that is to say the reflection mask 10 and/or the phase mask 16.

The partial optical units to which the partial pupils 41 to 49 are assigned are also spatially separated from one another.

A further embodiment of a projection optical unit 50 is described below with reference to FIGS. 8 and 9, which can be used instead of the projection optical units 7, 17 and 28. Components and functions that have already been explained above with reference to FIGS. 1 to 7 bear the same reference numerals and will not be discussed more specifically again. The projection optical unit 50 has in total, in a manner comparable to the projection optical unit 28 according to FIG. 5, four partial lenses or partial optical units, of which two partial lenses 51, 52 are illustrated in FIG. 8. The projection optical unit 50 is embodied overall as an optical unit purely comprising mirrors, that is to say as a catoptric optical unit. The mirrors M1 to M6 of the partial lenses 51, 52 are numbered consecutively in the order in which they reflect the imaging light 3 starting from the object field 4.

In a manner comparable to the partial lenses 29, 30 of the projection optical unit 28, the partial lenses 51, 52 are also mirror-symmetrical with respect to the mirror symmetry plane SE and separated from one another by the half-space separating plane HT. The same correspondingly holds true for the two partial lenses of the projection optical unit 50 which are not illustrated in FIG. 8.

Figure 12:
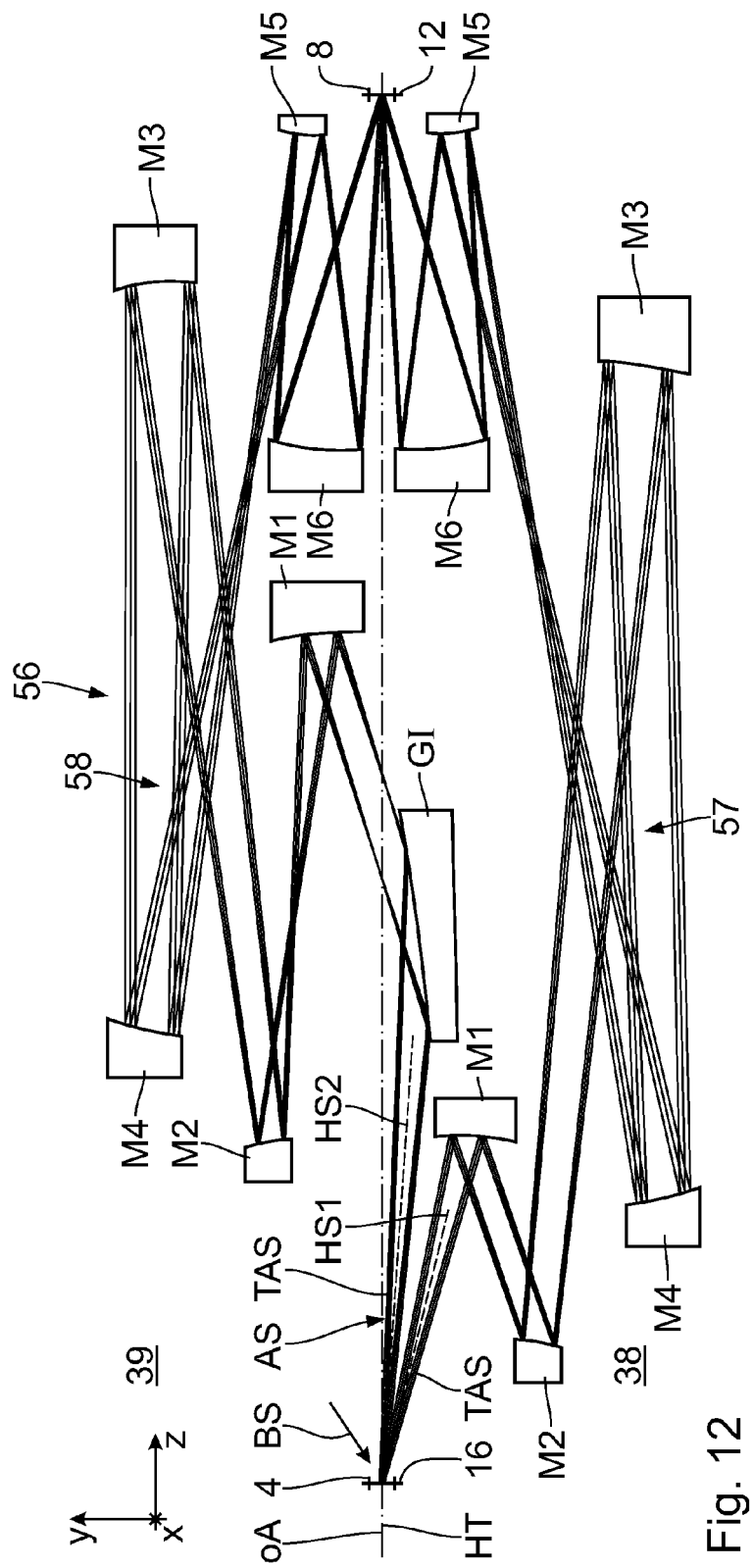
FIG. 12 shows in a meridional section a further embodiment of the projection optical unit.

The partial lens 51 corresponds, with regard to the optical design, to that imaging optical unit which is disclosed in FIG. 12 of U.S. Pat. No. 7,414,781 B2.

In the case of the projection optical unit 50, the arrangement of the partial pupils in the entrance pupil corresponds to that of the projection optical unit 28. FIG. 9 once again shows the arrangement of the partial pupils for the projection optical unit 50. The partial pupil 33 corresponds to the entrance pupil of the partial lens 51. The partial pupil 34 corresponds to the entrance pupil of the partial lens 52. The respective mirrors M1 to M6 of the two further partial lenses (not illustrated in FIG. 8) with the partial pupils 35 and 36 according to FIG. 9 are arranged with a corresponding construction and in a manner spaced apart from the xz plane (plane of the drawing in FIG. 8) in the +/−y-direction. For these two partial lenses that are not illustrated, the plane of the drawing according to FIG. 8 represents the mirror symmetry plane, on the one hand, and the half-space separating plane, on the other hand. These further partial lenses are constructed in the same way as the partial lenses 51, 52.

The partial lenses 51, 52 each have an intermediate image ZB in the respective partial imaging beam path between the mirrors M4 and M5. The two intermediate images ZB of the partial lenses 51, 52 are arranged such that they are completely spatially separated from one another.

A further embodiment of a projection optical unit 53 is explained below with reference to FIGS. 10 and 11, which can be used instead of the projection optical unit 50. Components and functions corresponding to those which have already been explained above with reference to FIGS. 1 and 9, and in particular with reference to FIGS. 8 and 9, bear the same reference numerals and will not be discussed more specifically again.

In contrast to the arrangement of the partial lenses 51, 52 of the projection optical unit 50 in a manner completely separated from one another by the half-space separating plane HT, the arrangement of partial lenses 54, 55 of the projection optical unit 53 is such that the mirrors M1 to M4 of the partial lenses 54, 55 are in each case arranged in one of the two half-spaces 38, 39, while the mirrors M5, M6 are arranged in the other of the two half-spaces 38, 39. In the case of the partial lens 54, the mirrors M1 to M4 are arranged in the half-space 38 and the mirrors M5 and M6 are arranged in the half-space 39. In the case of the partial lens 55, the mirrors M1 to M4 are arranged in the half-space 39 and the mirrors M5 and M6 are arranged in the half-space 38. The partial lenses 54, 55 therefore have interpenetrating designs. Despite this arrangement in the two half-spaces, the two partial lenses 54, 55 undergo transition to one another by mirroring about the mirror symmetry plane SE.

The two further partial lenses (not illustrated in FIG. 10) associated with the partial pupils 35 and 36 according to FIG. 11 are correspondingly arranged with mirrors M1 to M6 arranged in a distributed manner in two half-spaces separated from one another by the plane of the drawing in FIG. 10.

A further embodiment of a projection optical unit 56 is described below with reference to FIGS. 12 and 13. Components corresponding to those which have already been explained above with reference to FIGS. 1 to 11 bear the same reference numerals and will not be discussed more specifically again.

In contrast, for example, to the illustrations according to FIGS. 8 and 10, FIG. 12 illustrates a meridional section taken parallel to the yz plane.

Figure 13:
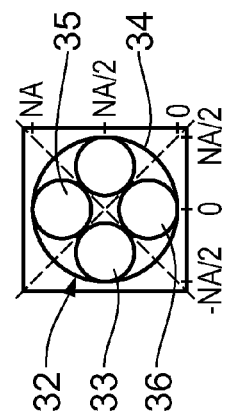
FIG. 13 shows, in an illustration similar to FIG. 6, an entrance pupil of the projection optical unit according to FIG. 12.

A partial lens 57 of the projection optical unit 56 belongs to the partial pupil 35 according to FIG. 13. A partial lens 58 belongs to the partial pupil 36 according to FIG. 13. That partial imaging beam path of the partial lens 57 which therefore belongs to the partial pupil 35 has a chief ray HS1 emerging from a central point of the object field 4, that is to say from a central object field point. Correspondingly, the partial lens 58 has a chief ray HS2 likewise emerging from the central object field point. The two chief rays HS1, HS2 of the two partial lenses 57, 58 run in the yz plane, that is to say in a plane running perpendicular to the main separating plane HT—running parallel to the xz plane—between the two half-spaces 38, 39. Both chief rays HS1, HS2 run in the same half-space 38, proceeding from the object field 4. This differentiates the projection optical unit 56 for example from the projection optical units 50, 53, where the chief rays—proceeding from the central object field point—of the two partial optical units, each mirror-symmetrical with respect to one another, run in different half-spaces 38, 39.

The course of the two chief rays HS1, HS2 of the projection optical unit 56 proceeding from the same half-space makes it possible to use a reflection mask 10, which is then imaged by the projection optical unit 56. An illumination beam path BS for the illumination of such a reflective reticle 10 is indicated by an arrow in FIG. 12. Such illumination, which impinges on the object field 4 at an angle with respect to the optical axis oA, is also designated as oblique illumination. The latter is defined by the fact that the center of an illumination pupil does not lie on the optical axis oA of the projection optical unit 56. This is clarified by the coordinate illustration of the entrance pupil 32 in FIG. 13. The optical axis intersects a pupil plane, in which the entrance pupil 32 is situated, at the coordinates (0,0). A center of the entrance pupil 32 lies at the coordinates (0,NA/2).

The two partial lenses 57, 58 do not undergo transition to one another by mirroring at a plane which contains the optical axis and which is perpendicular to the plane of the drawing in FIG. 12. Between the object field 4 and a first normal incidence mirror M1, the partial lens 58 has a grazing incidence mirror GI. For the purposes of this application, a normal incidence mirror is a mirror having an angle of incidence of at most 30°. A grazing incidence mirror is a mirror having an angle of incidence of at least 60°.

Besides the grazing incidence mirror GI, the partial lens 58 has six mirrors M1 to M6 in the further course of the partial imaging beam path. The partial lens 57 has six mirrors M1 to M6 between the object field 4 and the image field 8. Therefore, the two partial lenses 57, 58 have a different number of mirrors.

A further embodiment of a projection optical unit 59 is described below with reference to FIGS. 14 and 15, which can be used instead of the projection optical units explained above. Components and functions corresponding to those which have already been explained above with reference to FIGS. 1 to 13 bear the same reference numerals and will not be discussed more specifically again.

In contrast to the projection optical unit 50 according to FIG. 8, the projection optical unit 59 has a monolithically embodied mirror component 60 instead of the mirrors M6 of the two partial lenses 51, 52, the mirrors M6 being embodied separately from one another. The mirror component has two mutually separated beam-guiding regions 61, 62 for reflectively guiding the imaging light respectively of the partial lens 51, on the one hand, and of the partial lens 52, on the other hand, of the projection optical unit 59, that is to say for guiding a respective partial imaging beam path of the projection optical unit 59, in a manner guided via the two partial lenses 51, 52.

The monolithic mirror component 60 can overall even have four mutually separated beam-guiding regions for guiding the partial imaging beam paths, which are assigned to the partial pupils 33 to 36 of the projection optical unit 59. The two further beam-guiding regions of these additional partial lenses (not illustrated in FIG. 14) are arranged in a manner spaced apart from the plane of the drawing in FIG. 14 in the +/−y-direction and belong to the two partial lenses of the projection optical unit 59 which are not illustrated in FIG. 14.

In order to produce a patterned component, that is to say for example a semiconductor component in the form of an integrated circuit, e.g. in the form of a memory chip, firstly the reticle 10 and the wafer 12 are provided. Afterward, a structure on the reticle 10 is projected onto a light-sensitive layer of the wafer 12 with the aid of the projection exposure apparatus 1. By developing the light-sensitive layer, a micro- or nanostructure is then produced on the wafer 12. An imaging of the object field with a high numerical aperture and thus a correspondingly high structural resolution is ensured on account of the guidance of the imaging light 3 via the partial imaging beam paths running separately from one another.

The invention claimed is:

1. An imaging optical unit configured to image an object field into an image field, the imaging optical unit comprising:
   a plurality of optical components,
   wherein:
      an imaging beam path between the object field and the image field is subdivided into a plurality of partial imaging beam paths;
      the imaging optical unit is configured so that the partial imaging beam paths run between the object field and the image field completely separately guided by separate optical components;
      wherein each of the partial imaging beam paths runs between the object field and the image field through an intermediate image; and
      nowhere in the imaging beam path between the object field and the image field do the partial imaging beam paths impinge on identical regions of beam-guiding surfaces of the imaging optical unit.

2. The imaging optical unit of claim 1, wherein:
   the imaging optical unit comprises first and second partial optical units;
   the first partial optical unit has a partial pupil;
   the second partial optical unit has a partial pupil; and
   the partial pupil of the first partial optical unit is separated from the partial pupil of the second partial optical unit.

3. The imaging optical unit of claim 2, wherein the partial pupils are in a pupil of the imaging optical unit with multi-fold symmetry about a central optical axis perpendicular to the pupil.

4. The imaging optical unit of claim 3, wherein the partial optical units are arranged with multi-fold symmetry about the optical axis.

5. The imaging optical of claim 2, wherein the imaging optical unit comprises partial optical units, and at least one of the partial optical units has an image-side numerical aperture of 0.2.

6. The imaging optical unit of claim 1, wherein the optical components undergo a transition to one another by mirroring about a plane containing an optical axis of the imaging optical unit.

7. The imaging optical unit of claim 1, wherein the imaging optical unit comprises two partial optical units, each of the optical components of the two partial optical units of the imaging optical unit are completely arranged respectively in one of two half-spaces which are separated from each other by a plane containing an optical axis of the imaging optical unit.

8. The imaging optical unit of claim 1, wherein the imaging optical unit comprises partial optical units, the imaging optical unit has two half-spaces separated by a plane, and optical components of at least one of the partial optical units are arranged in both half-spaces.

9. The imaging optical unit of claim 1, wherein:
the imaging optical unit comprises partial optical units;
on an object side of the imaging optical unit, the partial imaging beam paths of at least two partial optical units have chief rays which:
proceed from a central object field point;
run in a meridional plane which is perpendicular to a plane which separates two half-spaces of the imaging optical unit; and
run in the same half-space.

10. The imaging optical unit of claim 1, wherein the imaging optical unit is a catoptric optical unit.

11. The imaging optical unit of claim 1, wherein at least one of the optical components is a monolithic optical component comprising at least two mutually separated beam-guiding regions configured to guide a respective partial imaging beam path.

12. An optical system, comprising:
an imaging optical unit according to claim 1; and
an illumination optical unit configured to illuminate the object field of the imaging optical unit.

13. An apparatus, comprising:
a light source;
an imaging optical unit according to claim 1; and
an illumination unit configured to illuminate the object plane of the imaging optical unit,
wherein the apparatus is a projection exposure apparatus.

14. The apparatus of claim 13, further comprising a holder configured to hold an object in the object plane of the imaging optical unit.

15. The apparatus of claim 14, further comprising a holder configured to hold an object in the image plane of the imaging optical unit.

16. A method of using a projection exposure apparatus which comprises an imaging optical unit and an illumination unit, the method comprising:
using the illumination unit to illuminate an object in an object plane of the imaging optical unit; and
using the imaging optical unit to image the object into an image plane of the imaging optical unit,
wherein the imaging optical unit is an imaging optical unit according to claim 1.

17. The method of claim 16, wherein the object comprises a reticle.

18. The method of claim 17, wherein a light-sensitive material is in the image plane.

19. An imaging optical unit configured to image an object field into an image field, the imaging optical unit comprising:
a plurality of optical components,
wherein:
the imaging optical unit is a catoptric imaging optical unit;
the imaging optical unit comprises first and second partial optical units;
the first partial optical unit has a partial pupil;
the second partial optical unit has a partial pupil;
the partial pupil of the first partial optical unit is separated from the partial pupil of the second partial optical unit;
an imaging beam path between the object field and the image field is subdivided into a plurality of partial imaging beam paths;
the imaging optical unit is configured so that the partial imaging beam paths run between the object field and the image field completely separately guided by the optical components; and
nowhere in the imaging beam path between the object field and the image field do the partial imaging beam paths impinge on identical regions of beam-guiding surfaces of the imaging optical unit.

20. The imaging optical unit of claim 19, wherein the imaging optical unit comprises partial optical units, and at least one of the partial optical units has an image-side numerical aperture of 0.2.

* * * * *